(12) United States Patent
Yamamoto et al.

(10) Patent No.: US 6,654,939 B2
(45) Date of Patent: Nov. 25, 2003

(54) METHOD OF DESIGNING LOGIC CIRCUIT, AND COMPUTER PRODUCT

(75) Inventors: Yu Yamamoto, Tokyo (JP); Yoshio Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 72 days.

(21) Appl. No.: 09/987,276

(22) Filed: Nov. 14, 2001

(65) Prior Publication Data

US 2002/0199161 A1 Dec. 26, 2002

(30) Foreign Application Priority Data

Jun. 20, 2001 (JP) .................................... 2001-186013

(51) Int. Cl.[7] .............................................. G06F 17/50
(52) U.S. Cl. .................... 716/6; 716/4; 716/5; 716/1
(58) Field of Search ........................ 716/1–14

(56) References Cited

U.S. PATENT DOCUMENTS 5,333,032 A * 7/1994 Matsumoto et al. ........... 716/6
5,572,712 A * 11/1996 Jamal ............................ 716/18
5,640,404 A * 6/1997 Satish ......................... 714/727
6,038,386 A * 3/2000 Jain ............................. 716/16
2002/0157074 A1 * 10/2002 Sato ............................ 716/10

FOREIGN PATENT DOCUMENTS

| JP | 5-46700 | 2/1993 |
| JP | 9-259173 | 10/1997 |
| JP | 10-125788 | 5/1998 |
| JP | 10-207937 | 8/1998 |
| JP | 2000-113019 | 4/2000 |

* cited by examiner

*Primary Examiner*—Vuthe Siek
*Assistant Examiner*—Sun James Lin
(74) *Attorney, Agent, or Firm*—Leydig, Voit & Mayer, Ltd.

(57) ABSTRACT

A scan flip flop with a selector is inserted into a position on a path where a timing error has occurred, based on timing analysis in a logic BIST mode, so that the path where the timing error has occurred is pipelined.

4 Claims, 12 Drawing Sheets

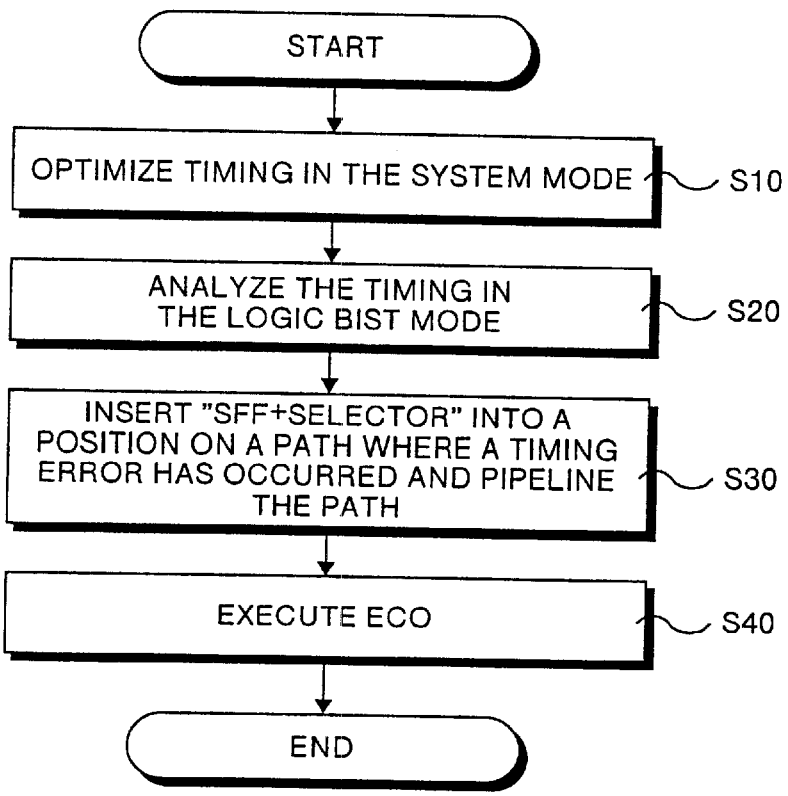
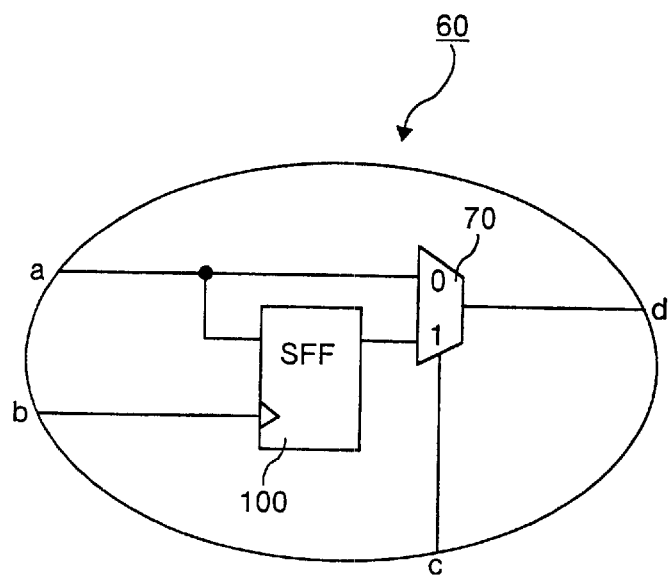

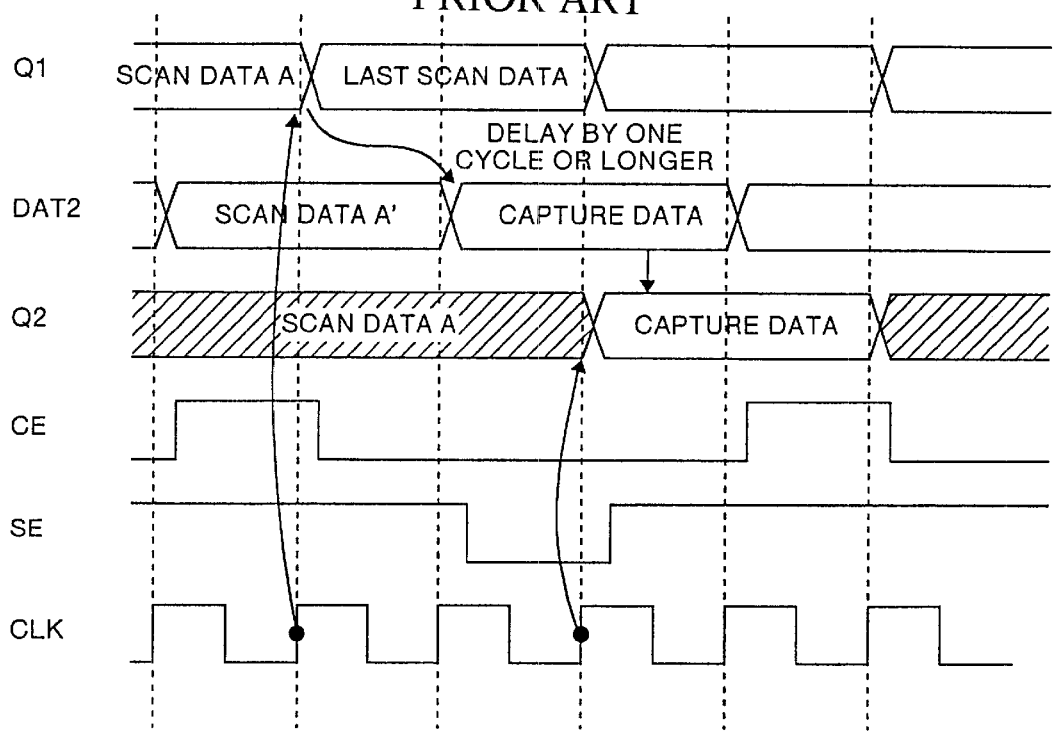

METHOD OF DESIGNING LOGIC CIRCUIT, AND COMPUTER PRODUCT

FIELD OF THE INVENTION

The present invention relates to a technology applying built-in self-testing (BIST) and a computer program for executing the method.

BACKGROUND OF THE INVENTION

In recent years, as a method of designing semiconductor integrated circuits such as LSIs or ASICs, attention has been focused on a technique for describing a configuration of a logic circuit as a target to be designed using a hardware description language ("HDL") and configuring the logic circuit as a combination of respective circuit elements based on this description. In this kind of technique, a circuit configuration is described in the HDL at a register transfer level ("RTL"), and this description is given to a logic synthesizing tool to synthesize logic, and a desired circuit is formed. The logic circuit configured in the above manner is subjected to optimization processing relating to its timing and area to obtain a final logic circuit.

At present, it has become common that design for testability (DFT) is adopted in design of the logic circuit using such an HDL based on the idea that testing is taken into account in a designing stage. This is a design technique for providing an additive circuit so as to improve observability and controllability of an inner side of the circuit so that testing the circuit becomes easier. Of the techniques for design for testability, attention is given to the built-in self-test (BIST) in which a BIST circuit is built-in, inside the LSI, because the circuit can efficiently perform tests with comparatively low cost.

Logic BIST as one of the BISTs has been widely accepted in the field of logic circuit design, and a test function effective in components, boards, and system test is provided. Software for supporting design based on the logic BIST generally has a system mode as an operation mode in actual use and a logic BIST mode as a built-in self-test circuit operation mode. The logic BIST mode is an integrated built-in automatic test mode for automatically creating, inserting, and verifying full scan of logic and the built-in self-test circuit.

That is, in the logic BIST mode, a BIST circuit, such as an LFSR (Line Feedback Shift Register) or an MISR (Multiple Input Signature Register), is automatically created, and in order to perform full scan, a flip flop (hereafter abbreviated as FF) that originally performs a temporary storage function is included with a selector as shown in FIG. 10, that is, a scan flip flop (hereafter abbreviated as SFF). A plurality of scan paths connect the flip flops in series using the selectors so that the flip flops can be freely connected to or separated from each other through combinational circuits or the like.

As shown in FIG. 10, the SFF 100 includes the FF 101 that performs a temporary storage function using an original clock signal as a trigger signal, and the selector 102 of the previous stage. The selector 102 selects a signal D from the combinational circuit in the previous stage when a scan mode signal SM is 0. At this time, the respective SFFs 100 are separated from each other, and the FF 101 performs functions as the main body of the FF of synchronizing to the clock signal CLK and transferring the signal D from the combinational circuit in the previous stage to a combinational circuit in the subsequent stage as output OUT.

On the other hand, when the scan mode signal SM is 1, the selector 102 selects a signal SI from the SFF in the previous stage. Accordingly, the SFFs 100 are cascade-connected to each other, and the FF 101 synchronizes to the clock signal CLK, and transfers the output signal of the SFF in the previous stage as output SO to the SFF in the subsequent stage.

In the design into which such a logic BIST is introduced, it is required to consider timing restrictions in an actual speed in both the system mode and the logic BIST mode. However, giving the timing restrictions to both of the modes reduces the convergence of its layout and increases the area and power consumption due to increase in the number of gates. However, optimization of timing to the system mode and the logic BIST mode is impossible in the current logic synthesizing tool.

Therefore, conventionally, as shown in FIG. 11, optimization of timing in the system mode is previously performed (step S100), a timing error in the system mode is first eliminated, and timing verification is then performed in the logic BIST mode (step S101).

However, paths used for the system mode and the logic BIST mode are different, so that timing restrictions to the paths are also different. Since optimization of the timing is performed in the system mode, a timing error does not occur in the system mode, but it may occur in the logic BIST mode. That is, as shown in FIG. 12A, when fixing of input data DATA to the FF satisfies a setup time ST, a timing error will not occur. However, as shown in FIG. 12B, if a path delay between the SFFs exceeds the timing restriction, for example, if the clock signal CLK input to the FF changes from 0 to 1 before the input data DATA to the FF is fixed, the fixing does not satisfy the setup time ST for the FF, so that a timing error will occur.

Therefore, conventionally, timing analysis is performed in the logic BIST mode, and when a timing error occurs, the SFF on the sending side of a position where the timing error has occurred is replaced by a multi-cycle path-capable scan flip flop MSFF as shown in FIG. 13A (step S102 in FIG. 11).

As shown in FIG. 13B, in the multi-cycle path-capable scan flip flop MSFF, scan data SD is selected when a clock enable signal CE is 1, and output Q1 of the flip flop FF is selected when the CE is 0. When a scan enable signal SE is 1, the mode is changed to scan mode for the logic BIST. When the SE is 1 and CE is 1, the SD is output to the Q1. When the SE is 1 and the CE is 0, output of the FF is looped and the same data is input. Therefore, the clock signal CLK to be input to the FF seems to be stopped. If the output Q1 of the multi-cycle path-capable scan flip flop MSFF on the sending side is looped until a data signal DAT2 is fixed and the SE is made to 0 after the DAT2 is fixed, the DAT2 is selected and output to the Q2.

FIG. 14 shows a time chart of the multi-cycle path-capable scan flip flop MSFF. When the clock enable signal CE is 0, the output of the FF is looped. Therefore, by giving a signal having a cycle twice as long as the CLK to the CE, the FF seems to operate in two cycles. Further, when the scan enable signal SE is 0, the CE is left to 0 as it is. When the FF is operated in one cycle, the SE is made to 0 at the first cycle. Therefore, when there is a delay by one cycle or longer for fixing the value of the DAT2, the fixing does not satisfy the setup time ST, so that a timing error occurs. However, when the FF is operated in two cycles, the SE can be made to 0 at the second cycle, and the value of the DAT2 has already been fixed by this time, therefore, the timing error can be avoided.

Conventionally, a timing error in the logic BIST mode is avoided by loosening timing restrictions by replacing the SFF with the multi-cycle path-capable scan flip flop MSFF to stop the clock signal until the data is fixed. Therefore, any path passing through the multi-cycle path-capable scan flip flop MSFF operates based on a clock signal CLK with a long cycle. Thus, the path related to the multi-cycle path-capable scan flip flop MSFF does not operate at actual speed. Accordingly, when the circuit is operated at actual speed in the conventional art, a timing error may occur.

SUMMARY OF THE INVENTION

It is an object of this invention to obtain a method of designing logic circuit that allows tests operated at an actual speed in both the system mode and the logic BIST mode so that a timing error can be avoided without fail. It is another object of this invention to provide a computer program that contains instructions which when executed on a computer realizes the method according to the present invention on the computer.

The method of designing logic circuit according to one aspect of this invention, is a method of designing logic circuit using a program having a system mode and a logic BIST mode. This method comprises the steps of: adjusting timing in the system mode during logic synthesis and layout; executing timing analysis in the logic BIST mode after the timing is adjusted; and inserting a scan flip flop with a selector, which includes a scan flip flop and a selector that can select output of the scan flip flop and input to the scan flip flop, into a position where a timing error has occurred based on the result of the timing analysis.

The computer program according to the another aspect of this invention contains instructions which when executed on a computer realizes the method according to the present invention on the computer. Thus, the method according to the present invention can be easily and automatically realized on the computer.

Other objects and features of this invention will become apparent from the following description with reference to the accompanying drawings.

BRIEF DESCRIPTION OF THE DRAWINGS

FIG. 1 is a flow chart showing an operating sequence of a first embodiment of the method of designing a logic circuit according to this invention;

FIG. 2 shows a circuit configuration of the scan flip flop with the selector;

FIG. 14 is a time chart showing the operation of the multi-cycle path-capable scan flip flop.

DESCRIPTION OF THE PREFERRED EMBODIMENTS

Embodiments of the method of designing logic circuit and the computer program according to this invention will be explained below with reference to the accompanying drawings.

FIG. 1 is a flow chart showing an operating sequence of a design supporting program of a logic circuit to which logic BIST is applied.

Timing optimization in the system mode is first executed during logics synthesis and layout of a logic circuit to be designed (step S10). Timing analysis in the logic BIST mode is then performed on this logic circuit (step S20). It is possible to identify a path where a timing error has occurred from the result of this timing analysis.

Figure 3:
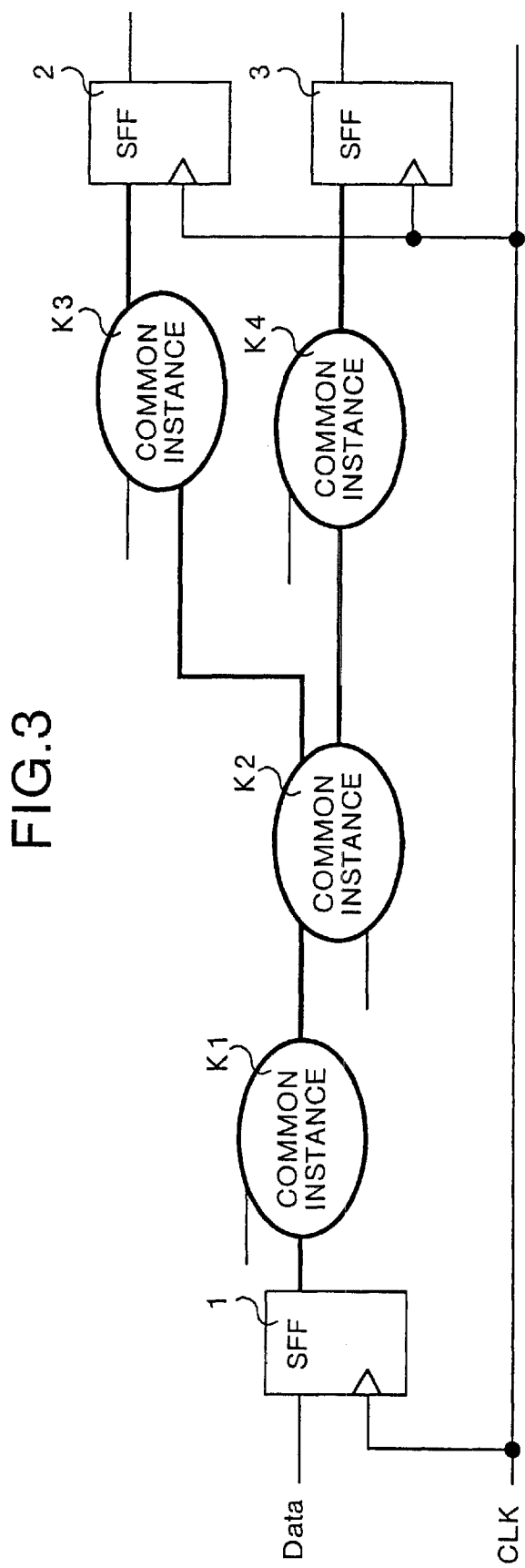
FIG. 3 shows an example of occurrence of timing errors on two paths.

FIG. 3 shows an example of paths where timing errors occur, and such paths are indicated by a heavy line. The details of FIG. 3 will be explained later. If fixing of DATA due to a path delay between the scan flip flops ("SFF") 1 and 2 and between the SFF 1 and 3 is set to satisfy a setup time ST for the SFF 2 or the SFF 3 on its receiving side, it is possible to avoid a timing error.

Figure 4:
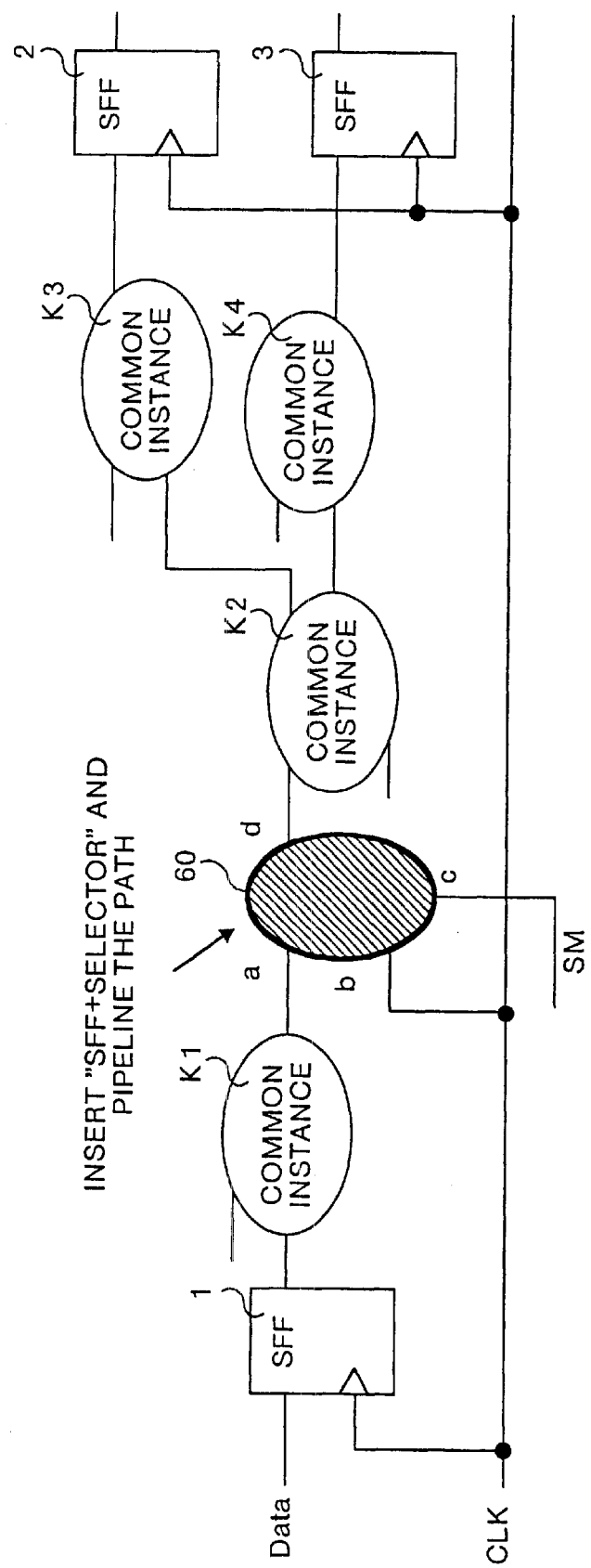
FIG. 4 shows an example of inserting the scan flip flop with the selector into the path.

Therefore, in a first embodiment, a SFF 60 with a selector as shown in FIG. 2 is inserted into a position where a timing error has occurred (step S30). FIG. 4 shows the SFF 60 with the selector inserted into a position on the paths where the timing errors have occurred as shown in FIG. 3.

The SFF 60 with the selector comprises the scan flip flop (SFF) 100 and a selector 70 provided in the subsequent stage as shown in FIG. 2. In the SFF 100, data is input into an input a and a clock signal CLK is input in an input b. Inputs and outputs cascade-connected to another SFFs are omitted. The output of the scan flip flop 100 and the input a to the scan flip flop 100 are input to the selector 70, and the selector 70 selects either one of these two input signals by a scan mode signal SM as a selection control signal. The scan mode signal SM becomes 0 when the system mode is selected. At this time, the selector 70 selects the input a to the scan flip flop 100, that is, the signal a that does not pass through the SFF 100 and outputs the signal as output d. On the other hand, the scan mode signal SM becomes 1 when the logic BIST mode is selected. At this time, the selector 70 selects the output of the SFF 100 and outputs the signal as the output d.

As explained above, by inserting the SFF 60 with the selector into the path where a timing error has occurred, the circuit is pipelined by inserting the SFF 100 into the path in the logic BIST mode. However, in the system mode, the circuit equivalent to the circuit in which timing has already been optimized in the system mode is operated without passing through the SFF 100.

Insertion and disposition of such an SFF 60 with the selector are finished, and then engineering change order (ECO) is executed.

In this first embodiment as explained above, when the logic BIST mode is selected, changing of a clock cycle that has been executed in the multi-cycle path-capable SFF is not performed, but by inserting the SFF 60 with the selector into the path to pipeline the circuit, timing restrictions are loosened. Therefore, the operation can be executed at an actual speed also in the logic BIST mode. Accordingly, a timing error occurring when the operation is executed at an actual speed can be eliminated in the system mode as well. Timing optimization is performed only in the system mode, thus a turn around time (TAT) is improved as compared to a case where timing optimization in the logic BIST is considered at the same time.

Figure 5:
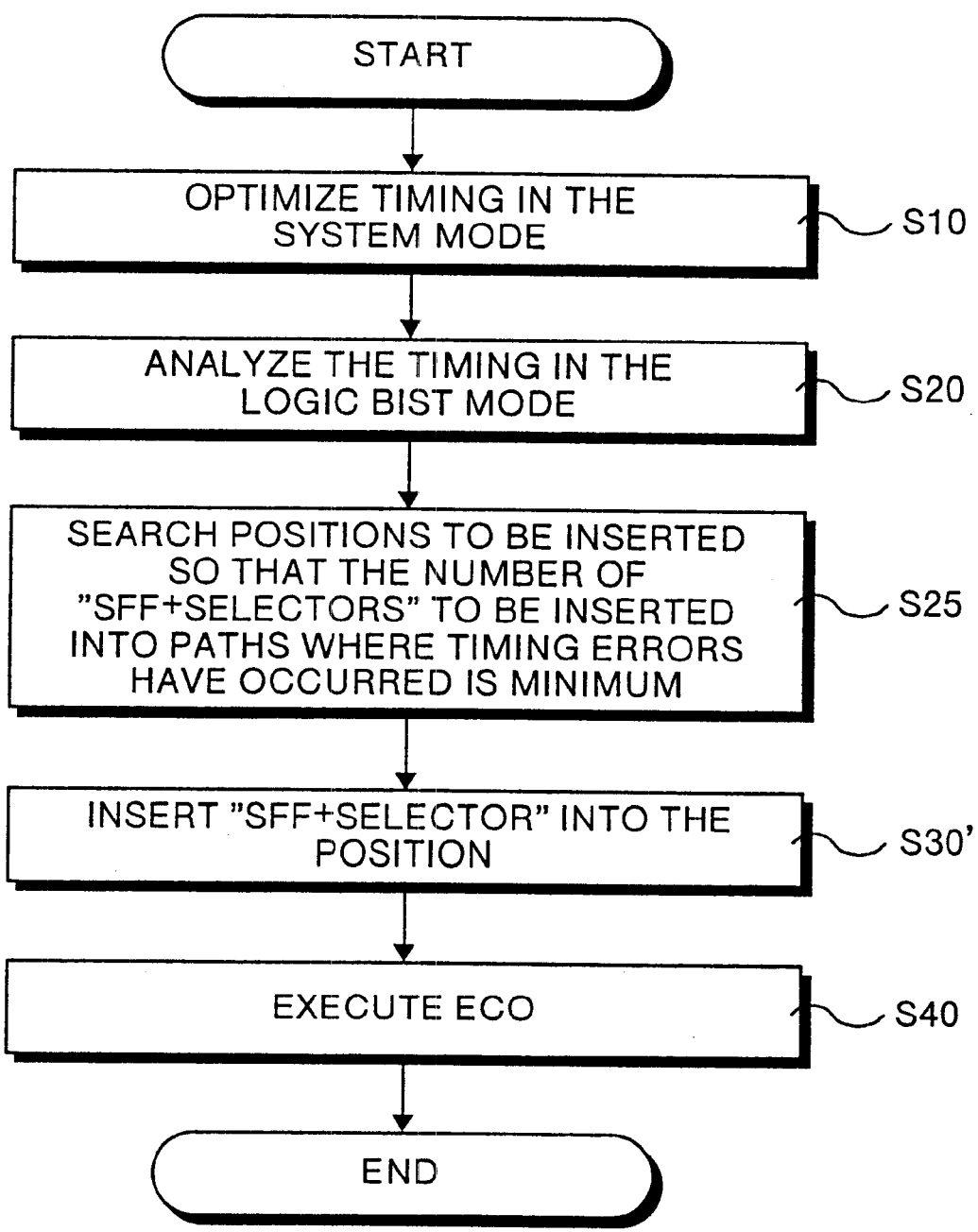
FIG. 5 is a flow chart showing an operating sequence of a second embodiment of the method of designing a logic circuit according to this invention.

A second embodiment of this invention will be explained below with reference to FIG. 5, etc. In FIG. 5, timing optimization in the system mode is first executed during logic synthesis and layout of a logic circuit to be designed (step S10). Timing analysis in the logic BIST mode is then performed on this logic circuit (step S20). It is possible to identify a path in which a timing error has occurred from the result of this timing analysis.

In FIG. 3 previously referred to, timing errors occur on both of the two paths. There are common instances K1 to K4 corresponding to combinational circuits between these paths. That is, the first path passes through the SFF 1—common instance K1—common instance K2—common instance K3—SFF 2, while the second path passes through the SFF 1—common instance K1—common instance K2—common instance K4—SFF 3. Timing errors have occurred on both of these paths.

In this case, by inserting the SFF 60 with the selector between the common instance K1 and the common instance K3, a timing error on the first path is assumed to be avoided. Further, by inserting the SFF 60 with the selector between the common instance K1 and the common instance K4, a timing error on the second path is assumed to be avoided.

At this time, when the SFF 60 with the selector is inserted between the common instance K2 and the common instance K3 in order to avoid a timing error on the first path, the timing error on the first path can be avoided. However, since the second path does not include the path between the common instance K2 and the common instance K3, it is required to insert another SFF 60 with the selector between the common instance K2 and the common instance K4 in order to avoid a timing error on the second path. If doing so, timing errors on the first and second paths can be avoided, but at least two SFFs 60 with the selectors are required.

In contrast, as shown in FIG. 4, when the SFF 60 with the selector is inserted between the common instance K1 and the common instance K2 in order to avoid a timing error on the first path, a timing error on the first path can be avoided and a timing error on the second path can also be avoided because the common instance K1 and the common instance K2 are also common instances for the second path. That is, in this case, by inserting one SFF 60 with the selector, timing errors on both of the first and second paths can be avoided.

In this second embodiment, at step S25, by searching any positions between the common instances on respective paths where timing errors have occurred, positions are found out so that the number of SFFs 60 with the selectors to be inserted is as small as possible, and the SFFs 60 with the selectors are inserted into these positions (step S30'). Insertion and disposition of such SFFs 60 with the selectors are finished, and then the ECO (Engineering Change Order) is executed.

In this second embodiment as explained above, positions between common instances on respective paths where timing errors have occurred are found out to insert the fewest possible SFFs 60 with the selectors into the positions, thus suppressing increase in the area of the circuit.

Figure 6:
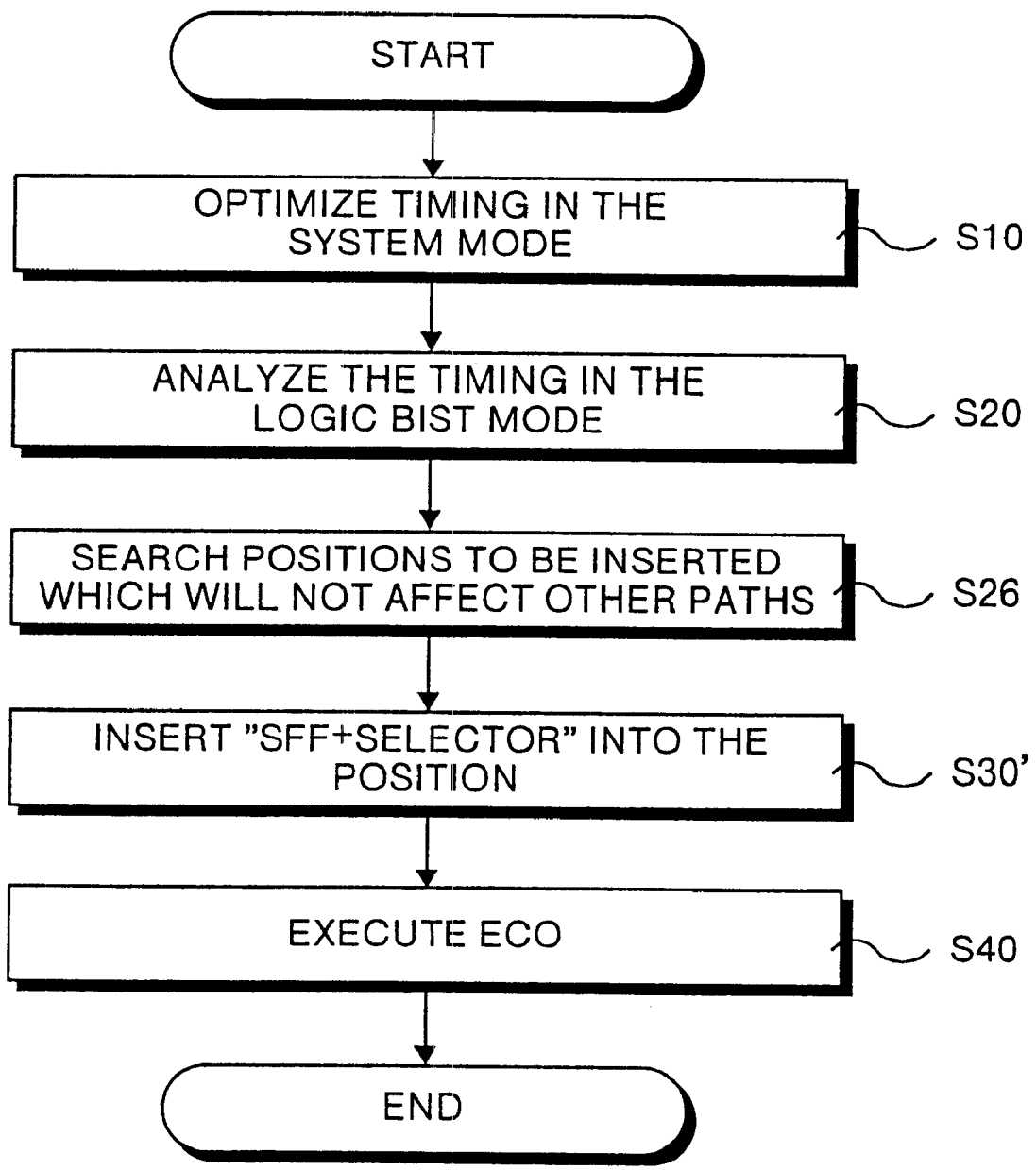
FIG. 6 is a flow chart showing an operating sequence of a third embodiment of the method of designing a logic circuit according to this invention.

A third embodiment of this invention will be explained below with reference to FIG. 6 and FIG. 7. In FIG. 6, timing optimization in the system mode is first executed during logic synthesis and layout of a logic circuit to be designed (step S10). Timing analysis in the logic BIST mode is then performed on this logic circuit (step S20). It is possible to identify a path where a timing error has occurred from the result of this timing analysis.

Figure 7:
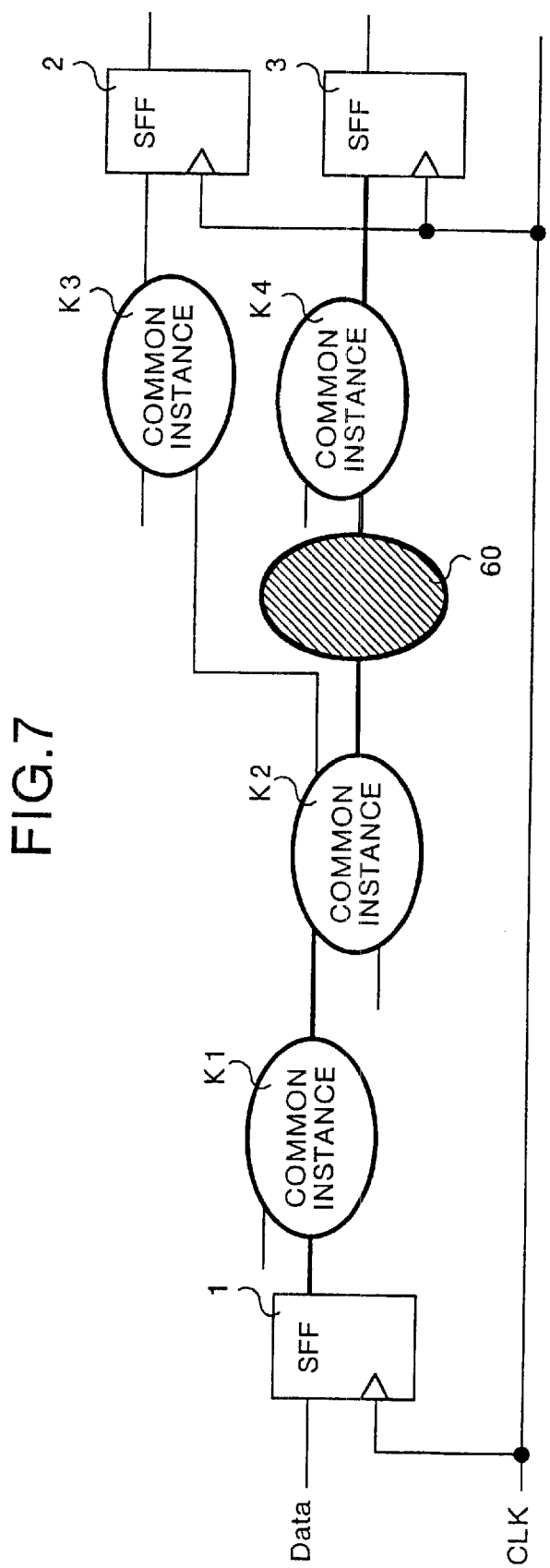
FIG. 7 shows an example of inserting the scan flip flop with the selector when a timing error has occurred on one of the paths.

As shown in FIG. 7, a timing error occurs in one of two paths that is indicated by the heavy line. There are common instances K1 to K4 corresponding to combinational circuits between these paths in the same manner as explained above. That is, a timing error has not occurred on the first path passing through the SFF 1—common instance K1—common instance K2—common instance K3—SFF 2, while a timing error has occurred on the second path passing through the SFF 1—common instance K1—common instance K2—common instance K4—SFF 3. In this case, the timing error on the second path is assumed to be avoided by inserting the SFF 60 with the selector between the common instance K1 and the common instance K4.

At this time, when the SFF 60 with the selector is inserted between the common instance K1 and the common instance K2 in order to avoid a timing error on the second path, the timing error on the second path can be avoided. However, since the path between the common instance K1 and the common instance K2 is also included in the first path, the first path may be affected by the insertion, thereby another error may occur.

In contrast, as shown in FIG. 7, when the SFF 60 with the selector is inserted between the common instance K2 and the common instance K4, the timing error on the second path can be avoided, and the possibility of occurrence of another problem on the first path can be eliminated because the path between the common instance K2 and the common instance K4 is not included in the first path.

In this third embodiment, at step S26, by searching any position between the common instances for respective paths where timing errors have occurred, positions to be inserted, which will not affect any other paths where another timing error has not occurred, are found out to insert the SFFs 60 with the selectors into these positions (step S30'). Insertion and disposition of such SFFs 60 with the selectors are finished, and then the ECO (Engineering Change Order) is executed.

In this third embodiment as explained above, positions to be inserted, which will not affect any other paths where another timing error has not occurred, are found out to insert the SFFs 60 with the selectors in these positions. Accordingly, influence over the paths with no timing error is eliminated, thus reducing the possibility that another error or problem may occur.

Figure 8:
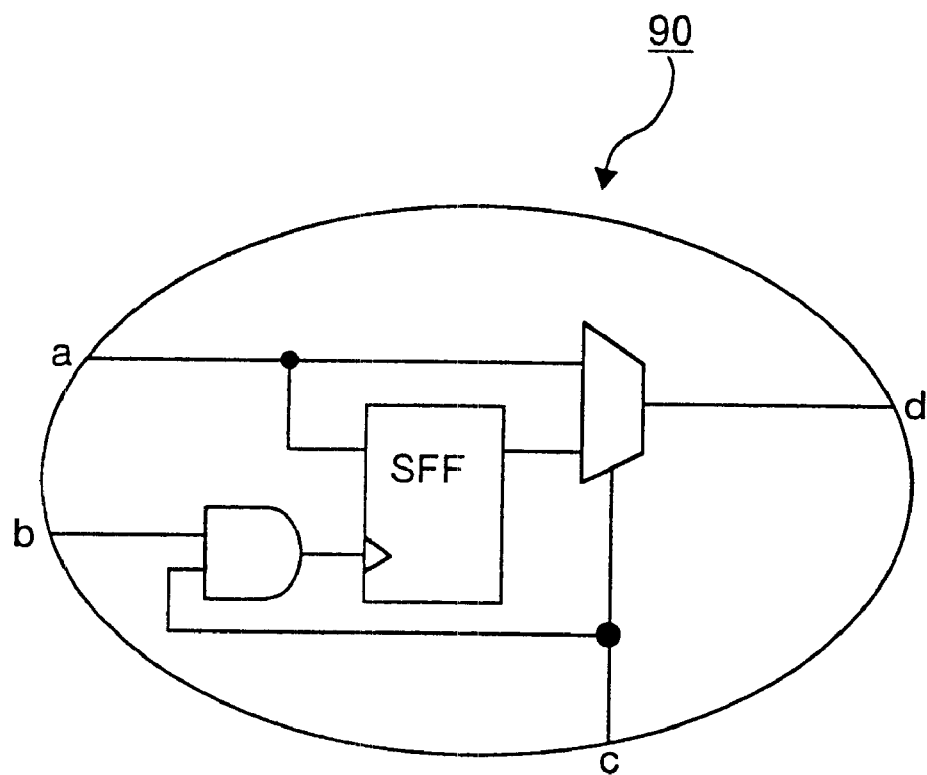
FIG. 8 shows a circuit configuration of the scan flip flop with the selector using a gated clock.

In these embodiments, an SFF 90 with a selector using a gated clock as shown in FIG. 8 may be used instead of the SFF 60 with the selector shown in FIG. 2. In the SFF 90 with the selector using the gated clock, a supply of a clock signal CLK to any SFF with the selector not required to operate is temporarily stopped, thus reducing power consumption.

Figure 9:
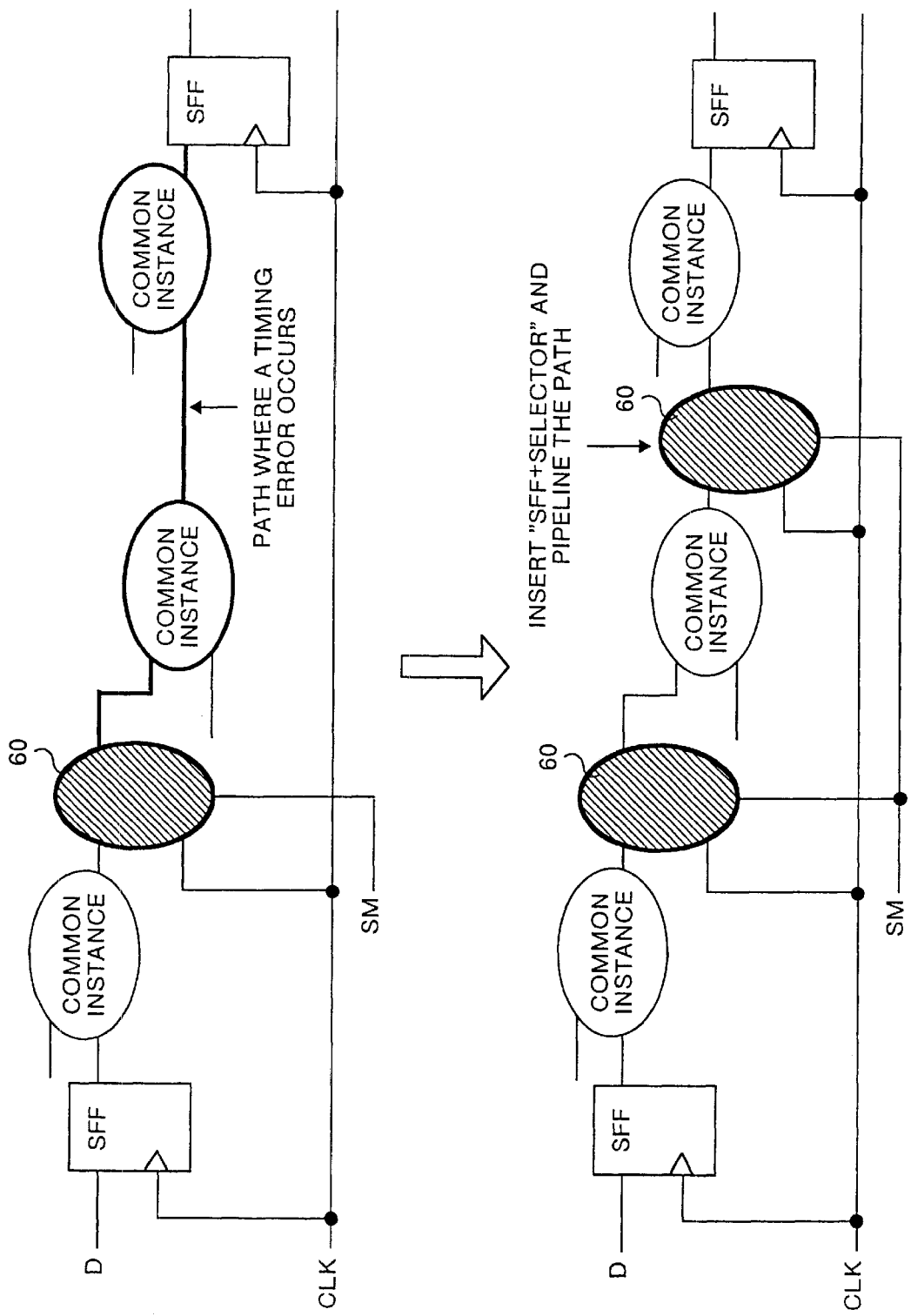
FIG. 9 shows the scan flip flops with selectors connected in multiple stages.
Figure 10:
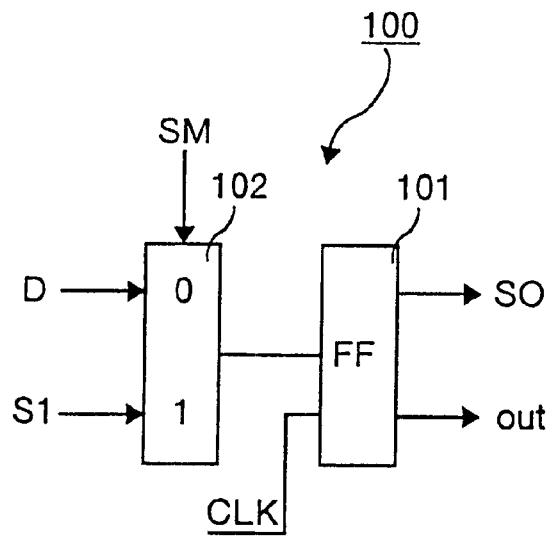
FIG. 10 shows a circuit configuration of the scan flip flop.
Figure 11:
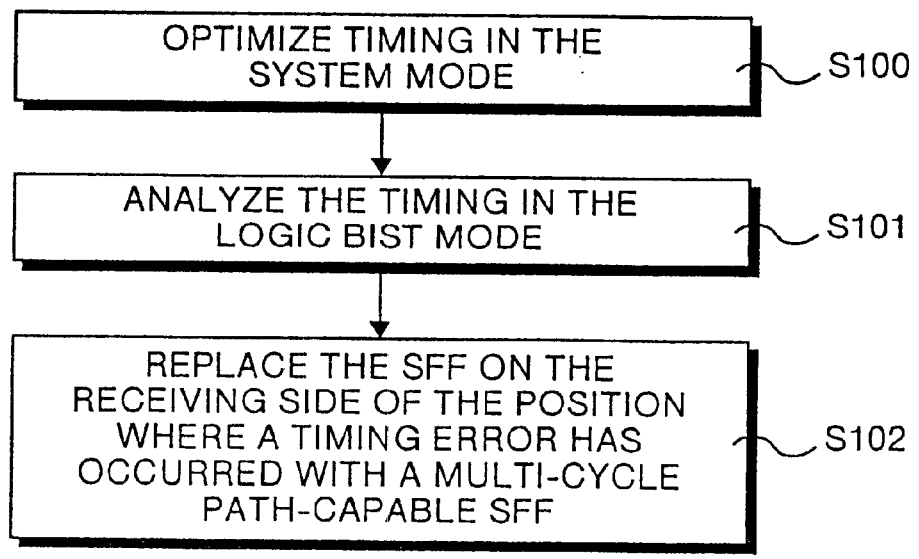
FIG. 11 is a flow chart showing a sequence of avoiding a timing error based on the conventional art.
Figure 12A:
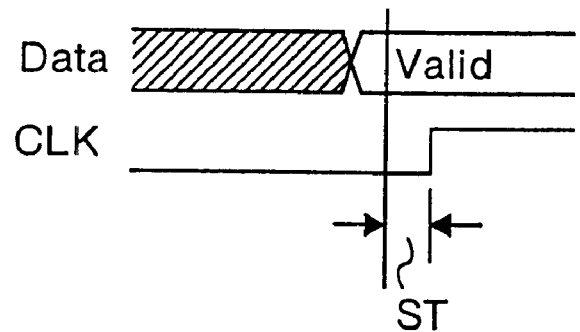
FIG. 12A and FIG. 12B are time charts showing how a timing error occurs.
Figure 12B:
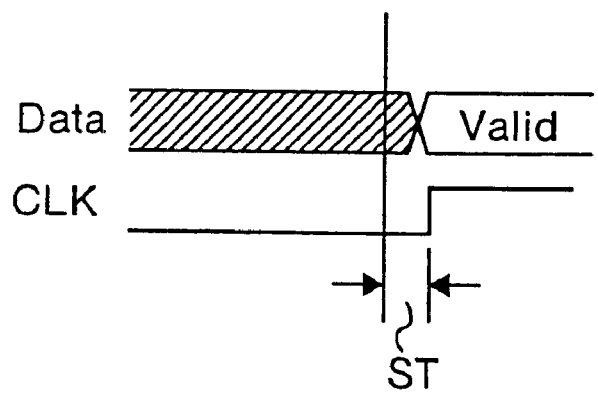
Figure 13A:
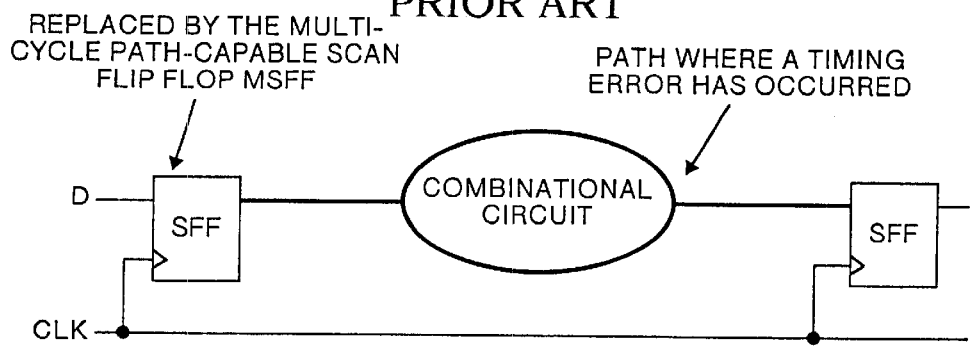
FIG. 13A and FIG. 13B show the conventional art, in which a circuit configuration of the multi-cycle path-capable scan flip flop is shown.
Figure 13B:
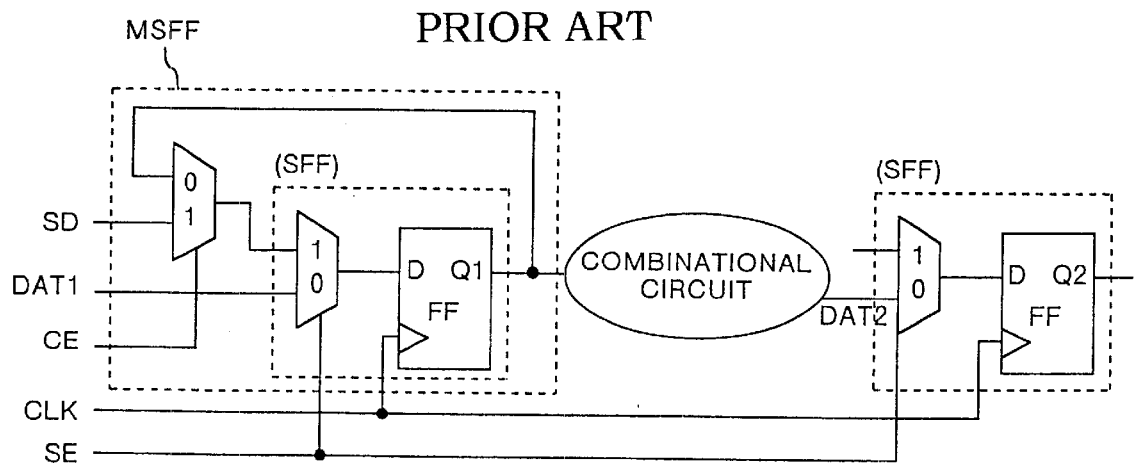

By the way, a timing error may newly occur because further delay occurs by inserting the SFF 60 with the selector. In order to avoid the new timing error, another SFF 60 with the selector may be inserted in multiple stages on one path as shown in FIG. 9.

As explained above, in the method of designing logic circuit according to one aspect of this invention, the scan flip flop with the selector is inserted into a position where a timing error has occurred based on timing analysis in the logic BIST mode to pipeline the path where the timing error has occurred. Therefore, the operation at an actual speed becomes possible even in the logic BIST mode, so that a timing error occurring when the operation is performed at an actual speed is eliminated even in the system mode. Further, the timing is optimized only in the system mode, thus a turn around time (TAT) is improved as compared to the case where timing optimization in the logic BIST is considered at the same time.

Further, a position(s) to be inserted is searched so that the number of scan flip flops with the selectors to be inserted becomes minimum, and the scan flip flop(s) with the selector is inserted into the found-out position(s), thus suppressing increase in the area of the circuit.

Further, a position(s) to be inserted that will not exert any effect on other path(s) is searched, and the scan flip flop(s) with the selector is inserted into the found-out position(s). Therefore, influence over the path(s) with no timing error can be minimized, thus reducing the possibility that another error or problem may occur.

The computer program according to this invention contains instructions which when executed on a computer realizes the method according to the present invention on the computer. Thus, the method according to the present invention can be easily and automatically realized on the computer. This computer program may be stored in any conventionally available memories and distributed. The computer program may even be downloaded over the Internet.

The "computer program" may be described in any desired conventionally available computer languages, regardless of a format of a source code or a binary code. This computer program is not necessarily structured as a single unit, and includes a computer program that is decentralized into a plurality of modules and libraries, and a computer program that co-operates with a separate program as represented by an OS (Operating System) thereby to achieve the function thereof.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of designing a logic circuit using a program having a system mode and a logic BIST mode, the method comprising:
    adjusting timing in the system mode during logic synthesis and layout;
    executing timing analysis in the logic BIST mode after the timing is adjusted; and
    inserting a scan flip flop with a selector for selecting output of the scan flip flop and input to the scan flip flop, into a position where a timing error has occurred, based on the timing analysis.

2. The method of designing a logic circuit according to claim 1, wherein, in inserting a scan flip flop, searching for positions so that the number of scan flip flops to be inserted is a minimum, and inserting only the minimum number of the scan flip flops.

3. The method of designing a logic circuit according to claim 1, wherein in inserting a scan flip flop, searching for positions that will not affect other paths, and inserting the scan flip flop only at a position not affecting the other paths.

4. A computer program containing instructions which, when executed on a computer, causes the computer to design a logic circuit using a program having a system mode and a logic BIST mode, the method comprising:
    adjusting timing in the system mode during logic synthesis and layout;
    executing timing analysis in the logic BIST mode after the timing is adjusted; and
    inserting a scan flip flop with a selector that can select output of the scan flip flop and input to the scan flip flop, into a position where a timing error has occurred, based on the timing analysis.

* * * * *